United States Patent
Takahashi et al.

(10) Patent No.: US 6,639,849 B2
(45) Date of Patent: Oct. 28, 2003

(54) NONVOLATILE SEMICONDUCTOR MEMORY DEVICE PROGRAMMING SECOND DYNAMIC REFERENCE CELL ACCORDING TO THRESHOLD VALUE OF FIRST DYNAMIC REFERENCE CELL

(75) Inventors: Satoshi Takahashi, Kawasaki (JP); Minoru Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/356,495

(22) Filed: Feb. 3, 2003

(65) Prior Publication Data

US 2003/0161188 A1 Aug. 28, 2003

(30) Foreign Application Priority Data

Feb. 28, 2002 (JP) .......................................... 2002-053994

(51) Int. Cl.[7] .............................................. G11C 16/04
(52) U.S. Cl. .............................. 365/189.07; 365/185.2; 365/185.22; 365/185.24; 365/210; 365/185.03
(58) Field of Search ..................... 365/189.07, 185.2, 365/185.22, 185.24, 210, 185.03

(56) References Cited

U.S. PATENT DOCUMENTS 6,538,922 B1 * 3/2003 Khalid et al. .......... 365/185.03
2001/0053104 A1 * 12/2001 Tran et al. ................... 365/210

* cited by examiner

Primary Examiner—Vu A. Le
Assistant Examiner—Pho M. Luu
(74) Attorney, Agent, or Firm—Arent Fox Kintner Plotkin & Kahn, PLLC

(57) ABSTRACT

In a nonvolatile semiconductor memory device, first and second dynamic reference cells are subjected to a same rewriting operation as performed to a memory cell. An average reference current is obtained from the first and second dynamic reference cells, and is compared with a current of data read from the memory cell so as to judge a level of the read data. In this configuration, the second dynamic reference cell is programmed according to a threshold value of the first dynamic reference cell.

10 Claims, 12 Drawing Sheets

NONVOLATILE SEMICONDUCTOR MEMORY DEVICE PROGRAMMING SECOND DYNAMIC REFERENCE CELL ACCORDING TO THRESHOLD VALUE OF FIRST DYNAMIC REFERENCE CELL

BACKGROUND OF THE INVENTION

1. Field of the Invention

The present invention generally relates to a nonvolatile semiconductor memory device and, more particularly, to a nonvolatile semiconductor memory device using a reference cell upon reading data.

2. Description of the Related Art

Generally, in a nonvolatile semiconductor memory device, such as a flash memory, a current of a reference cell set at a predetermined threshold value is used as a reference current, and upon reading data, a drain current of a read memory cell is compared with the reference current. According to whether or not the drain current of the read memory cell is larger than the reference current, the data is judged to be "1" or "0".

As data in the flash memory is rewritten number of times, a charge loss occurs in which a write charge is lost. Due to this charge loss, a threshold value of the memory cell of a core circuit tends to become smaller. By contrast, the threshold value of the reference cell remains fixed because data in the reference cell is normally not rewritten. Therefore, as the rewrite number of times increases, the fixed threshold value of the reference cell results in a read margin being unable to be secured sufficiently.

For the purpose of sufficiently securing the read margin, two types of reference cells are prepared as read reference cells for data "1" or "0", respectively, and an average current therebetween is used as the reference current, in which the same rewriting operation is performed not only to the memory cell but also to these reference cells. That is, in this method, a programmed reference cell Ref0 for data "0" and an erased reference cell Ref1 for data "1" are prepared, and an average current between two reference currents thereof is used as a read reference current.

In this method, the reference cell Ref0 is programmed in the same manner as the memory cell by using a program-verify reference cell PrRef set at a predetermined threshold value. In this program verification, the program-verify reference cell PrRef is compared with a write cell to which data is being written; then, when the write cell exceeds the threshold value of the program-verify reference cell PrRef, the writing of the data is ended. Thus, the reference cell Ref0 programmed as above is provided with only a lower limit of a threshold value, and the threshold value per se is indeterminate. Similarly, the reference cell Ref1 is provided with only an upper limit of a threshold value, and the threshold value per se is indeterminate.

As described above, the threshold values of the reference cells have probability distributions to a certain extent depending on writing/erasing properties thereof.

A distribution of a threshold value of a virtual read reference cell, which is an average between the two reference cells, exerts a large influence upon the read margin. When the threshold value of the virtual read reference cell is high, a difference from a threshold value for data "0" of the memory cell becomes small so that a margin to data "0" becomes small. On the other hand, when the threshold value of the virtual read reference cell is low, a difference from a threshold value for data "1" of the memory cell becomes small so that a margin to data "1" becomes small.

As described above, when an average current between two reference cells is used as a reference current, the average current varies, because threshold values of the reference cells vary depending on writing/erasing properties of the reference cells; accordingly, the read margin becomes unstable.

SUMMARY OF THE INVENTION

It is a general object of the present invention to provide an improved and useful nonvolatile semiconductor memory device in which the above-mentioned problems are eliminated.

A more specific object of the present invention is to provide a nonvolatile semiconductor memory device using an average current between two reference cells as a reference current with securing a stable read margin.

In order to achieve the above-mentioned objects, there is provided according to one aspect of the present invention a nonvolatile semiconductor memory device including a memory cell, first and second dynamic reference cells subjected to a same rewriting as performed to the memory cell, and a data judgment control circuit obtaining an average reference current from the first and second dynamic reference cells, and comparing a current of data read from the memory cell with the average reference current so as to judge the data, wherein the data judgment control circuit programs the second dynamic reference cell according to a threshold value of the first dynamic reference cell.

According to the present invention, the data judgment control circuit programs the second dynamic reference cell according to the threshold value of the first dynamic reference cell. Therefore, the second dynamic reference cell can be programmed so that a threshold value of the second dynamic reference cell becomes large when the threshold value of the first dynamic reference cell is small. Thus, a stable read margin can be provided for a nonvolatile semiconductor memory device using an average current between two reference cells as a reference current with securing.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1:
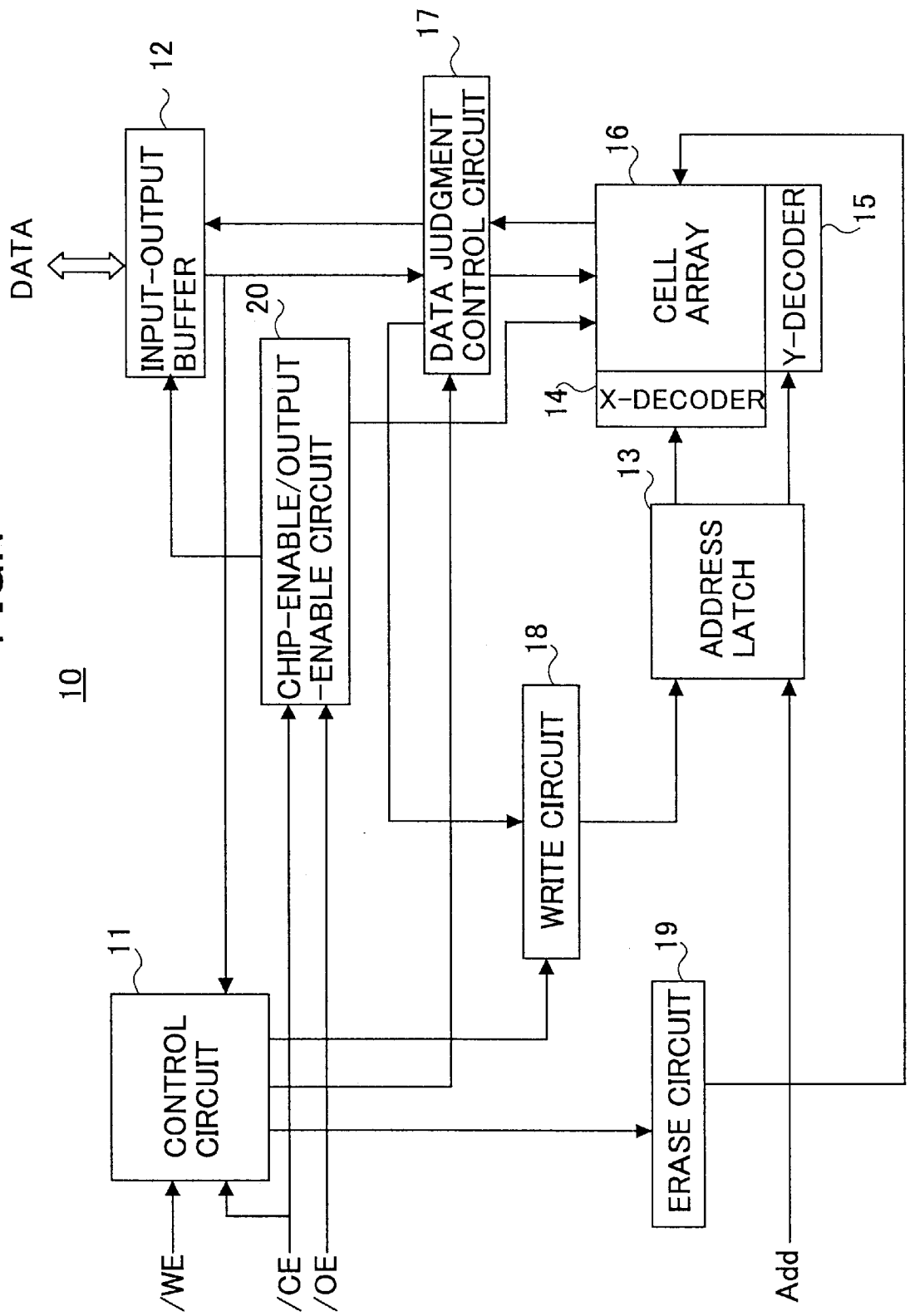
FIG. 1 shows a configuration of a nonvolatile semiconductor memory device according to the present invention.

FIG. 1 shows a configuration of a nonvolatile semiconductor memory device according to the present invention.

As shown in FIG. 1, a nonvolatile semiconductor memory device 10 comprises a control circuit 11, an input-output buffer 12, an address latch 13, an X-decoder 14, a Y-decoder 15, a cell array 16, a data judgment control circuit 17, a write circuit 18, an erase circuit 19, and a chip-enable/output-enable circuit 20.

The control circuit 11 receives an externally supplied control signal; according to the control signal, the control circuit 11 operates as a state machine, and controls each of the elements of the nonvolatile semiconductor memory device 10.

The input-output buffer 12 receives externally supplied data, and supplies this data to the data judgment control circuit 17. The address latch 13 receives and latches an externally supplied address signal, and supplies this address signal to the X-decoder 14 and the Y-decoder 15. The X-decoder 14 decodes the address signal supplied from the address latch 13, and activates a word line provided in the cell array 16 according to a result of the decoding. The Y-decoder 15 decodes the address signal supplied from the address latch 13; and according to a decoded address signal, the Y-decoder 15 selectively reads data in a bit line provided in the cell array 16, and supplies the data to the data judgment control circuit 17.

The cell array 16 includes an array of memory cell transistors, word lines, bit lines, and so forth, and stores data in each of the memory cell transistors. Upon reading data, the data is read from the memory cells specified by the activated word line to the bit lines. Upon a programming or erasing operation, the word lines and the bit lines are set at potentials appropriate to the respective operations so as to perform a charge injection operation or a charge extraction operation with respect to each of the memory cells.

The data judgment control circuit 17 compares a current of the data specified by the Y-decoder 15 and the X-decoder 14 and supplied from the cell array 16 with a reference current that is an average between currents of two reference cells so as to judge whether the data is "0" or "1". A result of this judgment is supplied to the input-output buffer 12 as read data. Additionally, a verifying operation accompanying the programming operation and the erasing operation is performed by comparing the current of the data specified by the Y-decoder 15 and the X-decoder 14 and supplied from the cell array 16 with a reference current provided by program-verify/erase-verify reference cells.

In the present invention, the two reference cells used for the above-described read data judgment are provided in the cell array 16 as dynamic reference cells subjected to a same rewriting operation as performed to the memory cell. Additionally, the program-verify/erase-verify reference cells are provided outside the cell array 16, for example, in the data judgment control circuit 17, and have fixed threshold values.

Under the control by the control circuit 11 and according to the write data supplied from the input-output buffer 12, the write circuit 18 drives the address latch 13, the X-decoder 14 and the Y-decoder 15 so as to write the data in the cell array 16. Additionally, upon the erasing operation, the erase circuit 19 generates the potentials applied to the word lines and the bit lines so as to erase data on an individual sector basis in the cell array 16.

The chip-enable/output-enable circuit 20 receives a chip enable signal /CE and an output enable signal /OE as externally supplied control signals, and controls the input-output buffer 12 and the cell array 16 to be in operation or out of operation.

Figure 2:
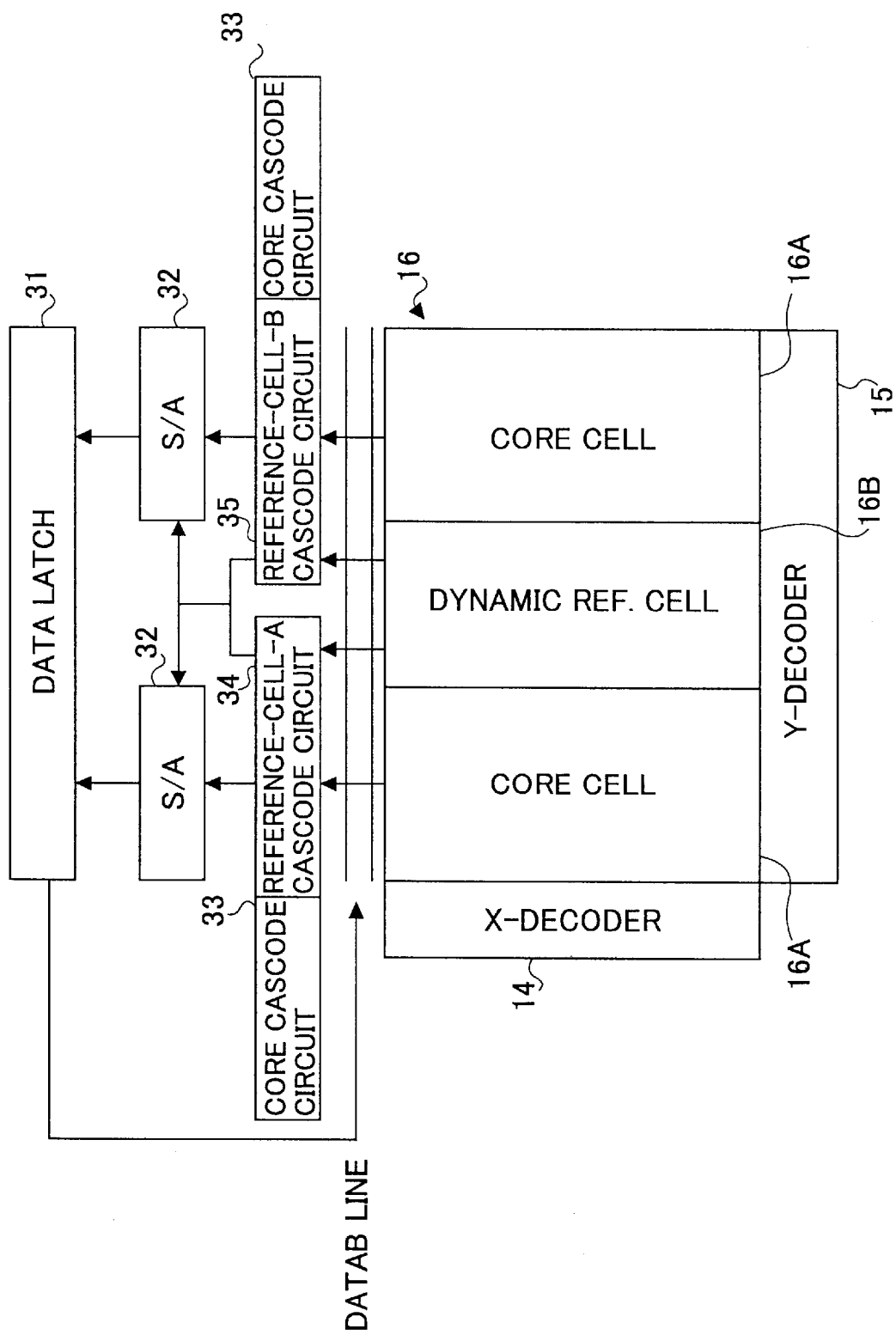
FIG. 2 shows a configuration of a circuit regarding an operation of reading data.

FIG. 2 shows a configuration of a circuit regarding an operation of reading data.

The circuit shown in FIG. 2 includes a data latch 31, sense amplifiers (S/A) 32, core cascode circuits 33, a reference-cell-A cascode circuit 34, and a reference-cell-B cascode circuit 35. This circuit judges a level of the data read from the cell array 16. This circuit is equivalent to the data judgment control circuit 17 shown in FIG. 1.

As shown in FIG. 2, the cell array 16 includes core cell areas 16A for storing the memory cells, and a dynamic reference cell area 16B for storing the dynamic reference cells. Data read from each of the core cell areas 16A is converted from a current signal to a voltage signal by the core cascode circuit 33, and is supplied to the sense amplifier 32. Additionally, a reference level read from a reference cell A of the dynamic reference cell area 16B is converted from a current signal to a voltage signal by the reference-cell-A cascode circuit 34. Further, a reference level read from a reference cell B of the dynamic reference cell area 16B is converted from a current signal to a voltage signal by the reference-cell-B cascode circuit 35. The output of the reference-cell-A cascode circuit 34 and the output of the reference-cell-B cascode circuit 35 are coupled and averaged, and the average data is supplied to the sense amplifier 32. The sense amplifier 32 compares a voltage level of the data supplied from the core cascode circuit 33 with a voltage level of the average data of the reference levels supplied from the reference-cell-A cascode circuit 34 and the reference-cell-B cascode circuit 35 so as to judge whether the data is "1" or "0". The judged data is supplied to the data latch 31.

Figure 3:
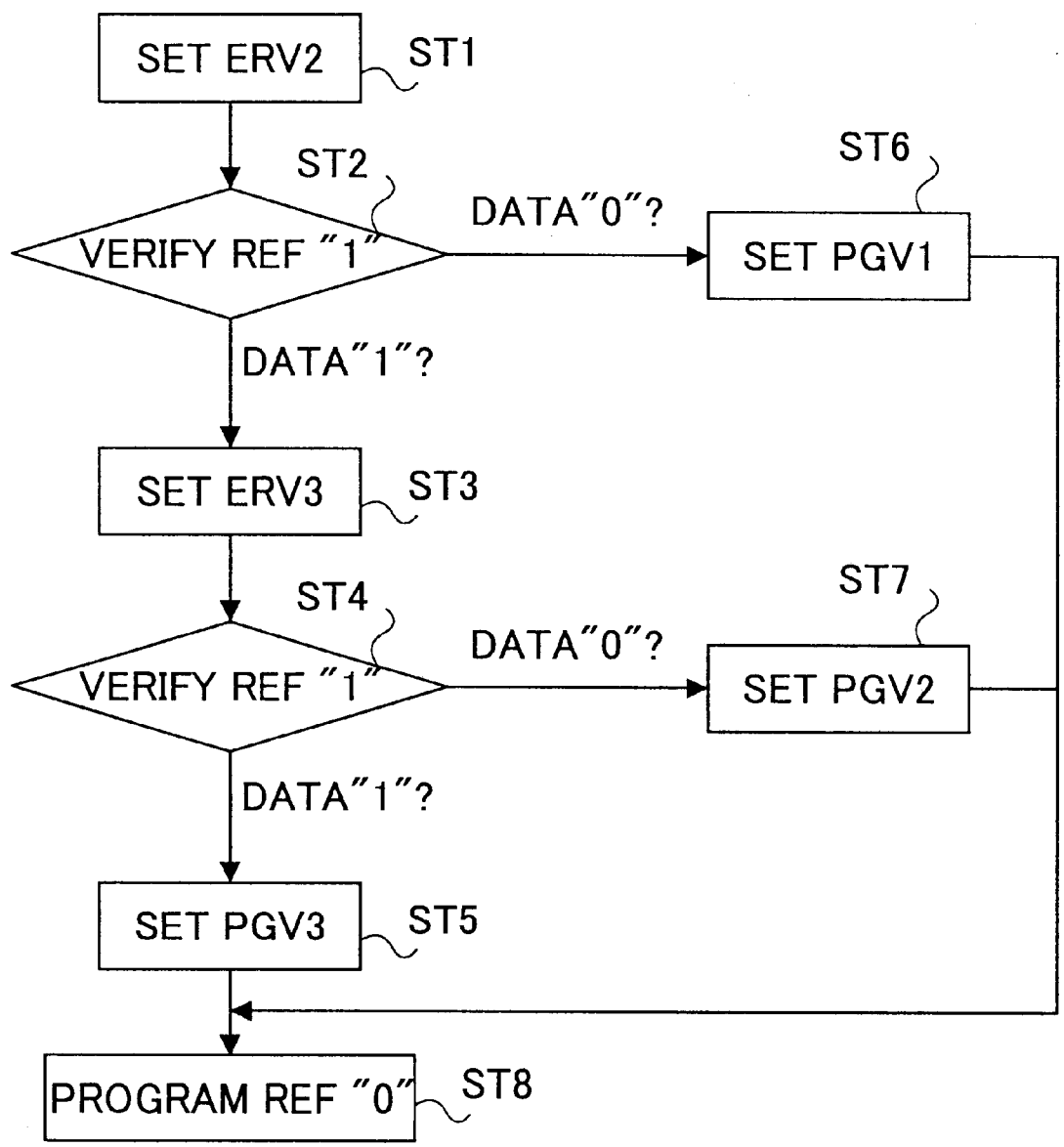
FIG. 3 is a flowchart of a method of setting dynamic reference cells according to a first embodiment of the present invention.
Figure 4:
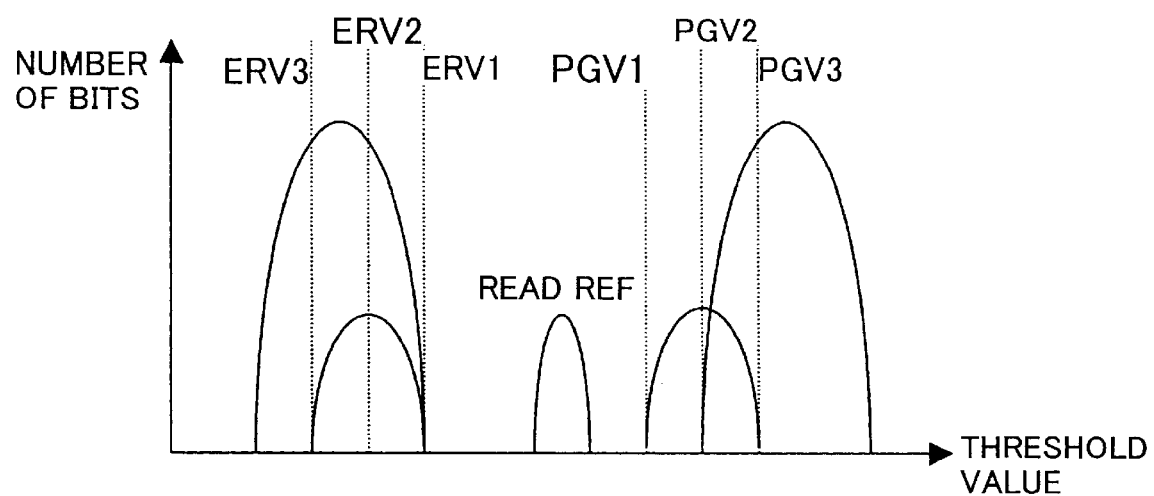
FIG. 4 is a diagram for explaining the method of setting the dynamic reference cells shown in FIG. 3.

FIG. 3 is a flowchart of a method of setting the dynamic reference cells according to a first embodiment of the present invention. FIG. 4 is a diagram for explaining the method of setting the dynamic reference cells shown in FIG. 3.

In the present first embodiment, a plurality of program-verify reference cells PGV1 to PGV3 and a plurality of erase-verify reference cells ERV1 to ERV3 are used so as to set threshold values of the dynamic reference cells for a reading operation. As shown in FIG. 4, the program-verify reference cells PGV1 to PGV3 have respective threshold values (PGV1<PGV2<PGV3), and the erase-verify reference cells ERV1 to ERV3 have respective threshold values (ERV1>ERV2>ERV3). At this point, the erase-verify reference cell ERV1 is used upon erasing the memory cells of the core cell area 16A, and the program-verify reference cell PGV2 is used upon programming the memory cells of the core cell area 16A.

First, the erase-verify reference cell ERV1 is used so as to erase the dynamic reference cells in the same manner as the memory cells of the core cell area 16A.

In step ST1 shown in FIG. 3, the erase-verify reference cell ERV2 is set as a reference cell to be used. In step ST2, the dynamic reference cell for data "1" is verified by comparing with the threshold value of the erase-verify reference cell ERV2. That is, data is judged to be "1" or "0".

When the data is judged to be "1", the erase-verify reference cell ERV3 is set as a reference cell to be used, in step ST3. In step ST4, the dynamic reference cell for data "1" is verified by comparing with the threshold value of the erase-verify reference cell ERV3. That is, the data is judged to be "1" or "0". When the data is judged to be "1", the threshold value of the dynamic reference cell for data "1" is verified to be smaller than the smallest threshold value of the erase-verify reference cell ERV3. Accordingly, in step ST5, the program-verify reference cell PGV3 having the largest threshold value is set as a reference cell to be used.

On the other hand, when the data is judged to be "0" in step ST2, the threshold value of the dynamic reference cell for data "1" is verified to be between the largest threshold value of the erase-verify reference cell ERV1 and the intermediate threshold value of the erase-verify reference cell ERV2. Accordingly, in step ST6, the program-verify reference cell PGV1 having the smallest threshold value is set as a reference cell to be used.

On the other hand, when the data is judged to be "0" in step ST4, the threshold value of the dynamic reference cell for data "1" is verified to be between the intermediate threshold value of the erase-verify reference cell ERV2 and the smallest threshold value of the erase-verify reference cell ERV3. Accordingly, in step ST7, the program-verify reference cell PGV2 having the intermediate threshold value is set as a reference cell to be used.

Finally, in step ST8, the dynamic reference cell for data "0" is programmed by using the program-verify reference cell PGV1, PGV2 or PGV3 set as above.

As described above, in the present first embodiment, a plurality of the erase-verify reference cells are used in comparison so as to judge a level of the threshold value of the erased dynamic reference cell for data "1"; and according to the judged level of the threshold value of the dynamic reference cell for data "1", the dynamic reference cell for data "0" is programmed. Thus, the dynamic reference cells can be set so that the average reference current becomes stable at a predetermined value by making the threshold value of the dynamic reference cell for data "0" large when the threshold value of the dynamic reference cell for data "1" is small.

Figure 5:
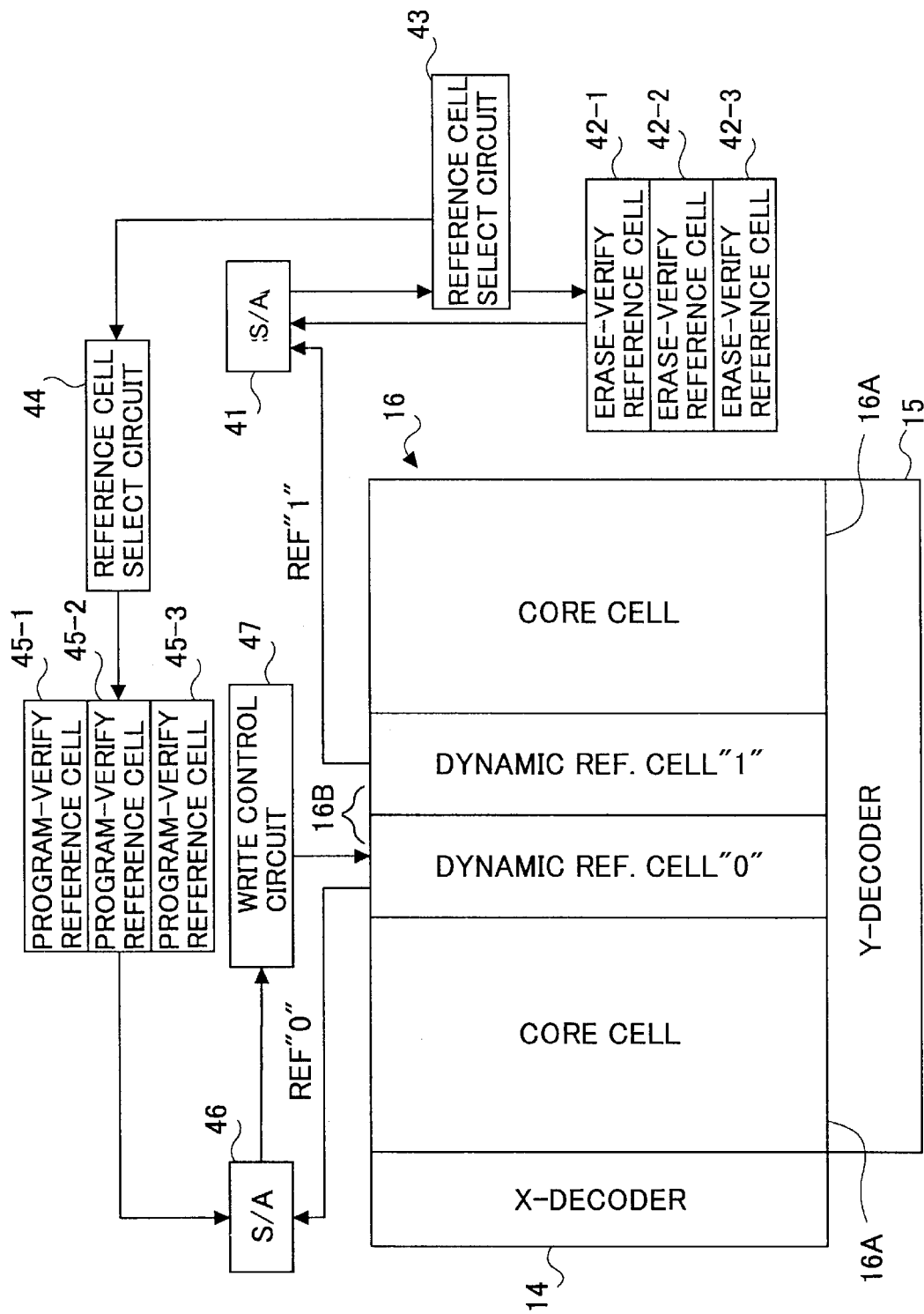
FIG. 5 shows a configuration of a circuit performing an operation of setting the reference cells according to the first embodiment of the present invention.

FIG. 5 shows a configuration of a circuit performing an operation of setting the reference cells according to the first embodiment of the present invention.

The circuit shown in FIG. 5 includes a sense amplifier (S/A) 41, erase-verify reference cells 42-1 to 42-3, a reference cell select circuit 43, a reference cell select circuit 44, program-verify reference cells 45-1 to 45-3, and a sense amplifier (S/A) 46. This circuit performs the operation of setting threshold values of the dynamic reference cells stored in the dynamic reference cell area 16B.

The sense amplifier 41 compares a current of the dynamic reference cell for data "1" read from the dynamic reference cell area 16B with a reference current from one of the erase-verify reference cells 42-1 to 42-3 selected by the reference cell select circuit 43. This comparison corresponds to step st1 to step st4 shown in FIG. 3.

According to a result of the comparison, and also according to which of the erase-verify reference cells 42-1 to 42-3 is selected, the reference cell select circuit 43 informs the reference cell select circuit 44 which of the program-verify reference cells 45-1 to 45-3 is to be selected. According to this information, the reference cell select circuit 44 selects one of the program-verify reference cells 45-1 to 45-3. This selection corresponds to step st5 to step st7 shown in FIG. 3.

According to a reference current from the selected program-verify reference cell, the sense amplifier 46 verifies the dynamic reference cell for data "0" read from the dynamic reference cell area 16B. According to a result of this verification, a write control circuit 47 programs the dynamic reference cell for data "0" stored in the dynamic reference cell area 16B.

As described above, a plurality of the erase-verify reference cells are used in the comparison so as to judge a level of the threshold value of the erased dynamic reference cell for data "1". Further, according to the judged level of the threshold value of the dynamic reference cell for data "1", one of a plurality of the program-verify reference cells is selected. Then, the dynamic reference cell for data "0" is programmed by using the threshold value of the selected program-verify reference cell.

Hereinbelow, descriptions will be given of other embodiments according to the present invention.

In the foregoing first embodiment, the nonvolatile semiconductor memory device is a normal flash memory using polysilicon as a floating gate. By contrast, in the following embodiments, the nonvolatile semiconductor memory device is a flash memory of a type in which electric charge is stored in a trap layer including a nitride film so that one memory cell can store 2-bit information.

In the flash memory of this type, a layer composed of an oxide film, a nitride film and an oxide film is provided between a control gate and a substrate, and electric charge is trapped in the nitride film so as to vary a threshold value for distinguishing data "0" and data "1". In this case, since the trap layer including the nitride film is an insulating film, electric charge does not move therein. Accordingly, by storing electric charge independently at each of both ends of the trap layer, one cell can store 2-bit information. The 2-bit information can be read separately by interchanging a drain and a source upon a reading operation.

Data is written to a memory cell by electron injection using channel hot electrons. For example, approximately 9V is applied to a gate electrode, approximately 5V is applied to the drain, and 0V is applied to the source and the substrate so that hot electrons generated in a channel are trapped in the nitride film. In this course, the hot electrons are injected into a part near the drain in the nitride film. Data is erased from a memory cell by hole injection according to hot hole injection. For example, approximately −6V is applied to the gate electrode, and approximately 6V is applied to the drain so that holes generated by an inter-band tunnel current flowing from the drain to the substrate are injected into the nitride film so as to neutralize and thus erase electric charge. When electric charge for 2-bit information is injected per cell, the same voltage as applied to the drain is applied to the source so as to perform an erasing operation as described above. The reading operation can be performed by a reverse read in which the drain is reversed, compared to the above-described writing operation. Specifically, a diffusion layer on a reverse side from a diffusion layer applied with approximately 5V upon the writing operation is used as the drain, and approximately 5V is applied to the gate electrode, approximately 1.5V is applied to the drain, and 0V is applied to the source and the substrate. When electric charge is stored in a part near the source in the nitride film, the channel is not formed due to the trapped charge, and thus, no current flows. Accordingly, data "0" can be read.

Thus, in the flash memory capable of storing two bits per cell, upon reading one bit of the two bits, the threshold value varies according to a state of the other bit than the one bit selected to be read. In other words, when the other-bit side is in a programmed state, the threshold value becomes relatively large due to an influence of this programmed trapped charge; on the other hand, when the other-bit side is in an erased state, the threshold value becomes relatively small because no trapped charge exists due to this erased state.

Accordingly, in the flash memory as described above, the threshold values need to be set in consideration of the state of the other bit than the one bit selected to be read. The following four cases (1) to (4) are conceivable according to the state of the other bit than the one bit selected to be read for reference:

(1) A state in which no charge is stored in the other-bit side in the dynamic reference cell for data "1", and no charge is stored in the other-bit side in the dynamic reference cell for data "0";

(2) A state in which charge is stored in the other-bit side in the dynamic reference cell for data "1", and no charge is stored in the other-bit side in the dynamic reference cell for data "0";

(3) A state in which no charge is stored in the other-bit side in the dynamic reference cell for data "1", and charge is stored in the other-bit side in the dynamic reference cell for data "0"; and (4) A state in which charge is stored in the other-bit side in the dynamic reference cell for data "1", and charge is stored in the other-bit side in the dynamic reference cell for data "0".

Among these cases, in the case (1), the threshold values can be set by the method of setting the dynamic reference cells shown in the flowchart of FIG. 3.

Figure 6:
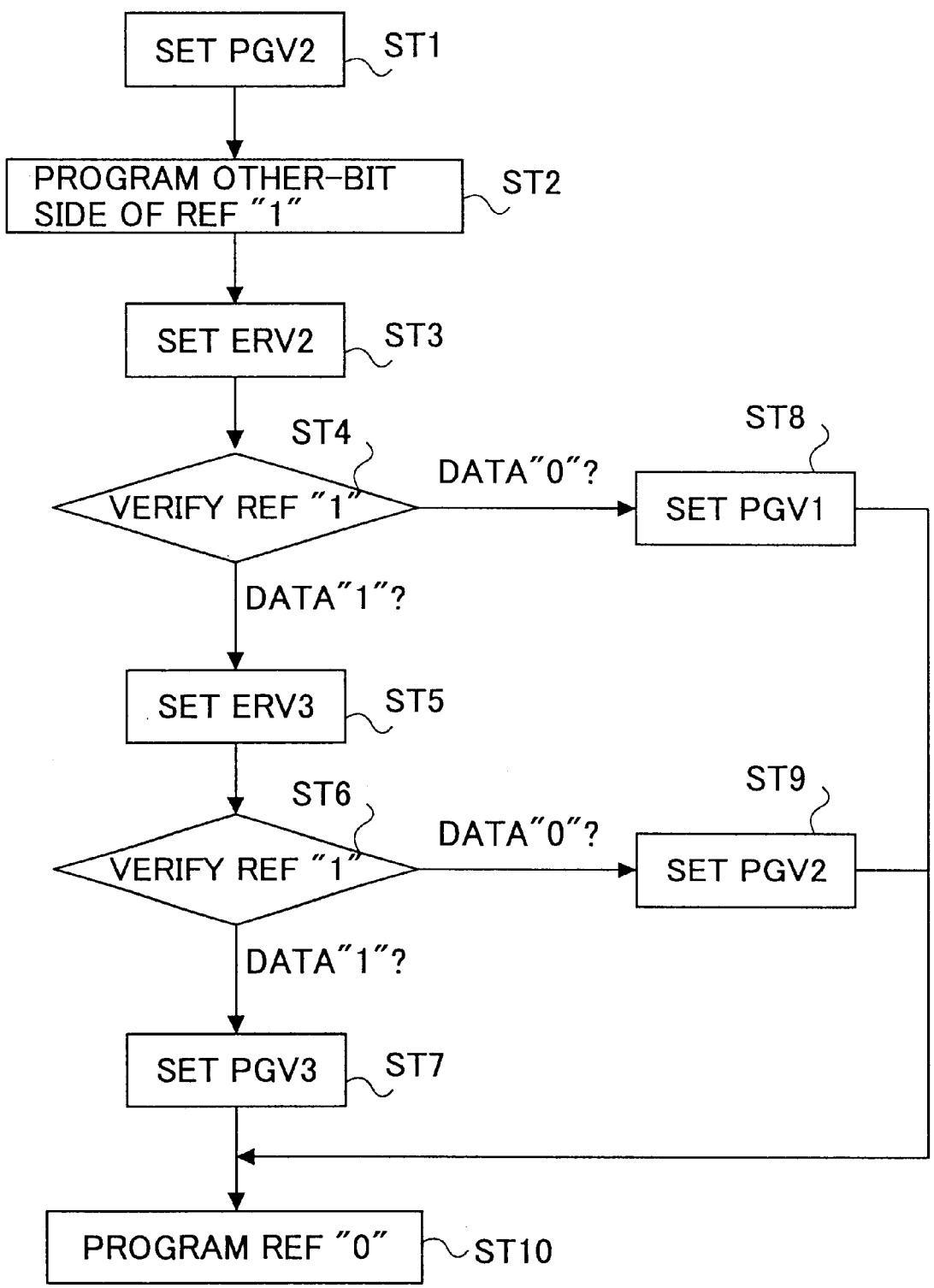
FIG. 6 is a flowchart of a method of setting dynamic reference cells according to a second embodiment of the present invention.

FIG. 6 is a flowchart of a method of setting the dynamic reference cells according to a second embodiment of the present invention. The present second embodiment corresponds to the case (2), i.e., the state in which charge is stored in the other-bit side in the dynamic reference cell for data "1", and no charge is stored in the other-bit side in the dynamic reference cell for data "0".

Initially, each of the dynamic reference cells is set in a state of "1" where both bits are erased.

In step ST1 shown in FIG. 6, the program-verify reference cell PGV2 is set as a reference cell to be used. In step ST2, the other-bit side than the one-bit side selected for reference in the dynamic reference cell for data "1" is programmed by using the program-verify reference cell PGV2.

The following steps ST3 to ST10 are basically the same as the steps ST1 to ST8 shown in FIG. 3. By this procedure, a level of the threshold value for the selected side of the dynamic reference cell for data "1" is judged, and the selected side of the dynamic reference cell for data "0" is programmed.

As described above, in the present second embodiment, the other-bit side in the dynamic reference cell for data "1" is programmed so as to store charge therein. In this state, the level of the threshold value for the selected side of the dynamic reference cell for data "1" is judged, and the selected side of the dynamic reference cell for data "0" is programmed.

Figure 7:
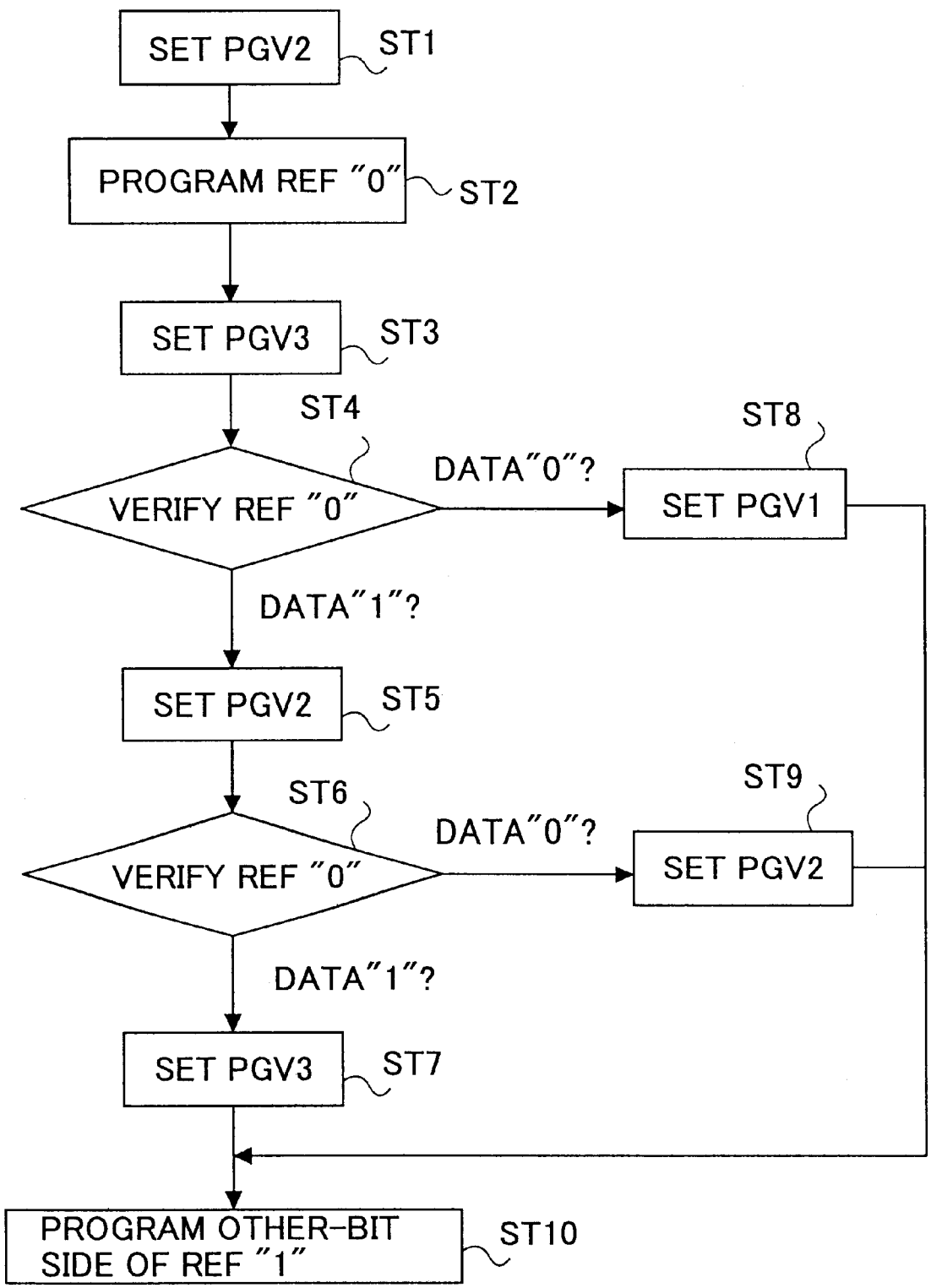
FIG. 7 is a flowchart of a method of setting dynamic reference cells according to a third embodiment of the present invention.

FIG. 7 is a flowchart of a method of setting the dynamic reference cells according to a third embodiment of the present invention. The present third embodiment corresponds to the case (2), i.e., the state in which charge is stored in the other-bit side in the dynamic reference cell for data "1", and no charge is stored in the other-bit side in the dynamic reference cell for data "0".

Initially, each of the dynamic reference cells is set in a state of "1" where both bits are erased.

In step ST1 shown in FIG. 7, the program-verify reference cell PGV2 is set as a reference cell to be used. In step ST2, the one-bit side selected for reference in the dynamic reference cell for data "0" is programmed by using the program-verify reference cell PGV2.

In step ST3, the program-verify reference cell PGV3 is set as a reference cell to be used. In step ST4, the selected side of the dynamic reference cell for data "0" is verified by comparing with the threshold value of the program-verify reference cell PGV3. That is, data is judged to be "1" or "0".

When the data is judged to be "1", the program-verify reference cell PGV2 is set as a reference cell to be used, in step ST5. In step ST6, the selected side of the dynamic reference cell for data "0" is verified by comparing with the threshold value of the program-verify reference cell PGV2. That is, the data is judged to be "1" or "0". When the data is judged to be "1", the program-verify reference cell PGV3 having the largest threshold value is set as a reference cell to be used, in step ST7.

On the other hand, when the data is judged to be "0" in step ST4, the program-verify reference cell PGV1 having the smallest threshold value is set as a reference cell to be used, in step ST8.

On the other hand, when the data is judged to be "0" in step ST6, the program-verify reference cell PGV2 having the intermediate threshold value is set as a reference cell to be used, in step ST9.

Finally, in step ST10, the other-bit side than the one-bit side selected for reference in the dynamic reference cell for data "1" is programmed by using the program-verify reference cell PGV1, PGV2 or PGV3 set as above.

As described above, in the present third embodiment, a plurality of the program-verify reference cells are used in comparison so as to judge a level of the threshold value of the dynamic reference cell for data "0"; and according to the judged level of the threshold value of the dynamic reference cell for data "0", the other-bit side of the dynamic reference cell for data "1" is programmed. Accordingly, when the threshold value of the dynamic reference cell for data "0" is small (e.g., between the threshold values of the program-verify reference cell PGV1 and the program-verify reference cell PGV2), the threshold value of the selected side of the dynamic reference cell for data "1" can be made large by programming the other-bit side of the dynamic reference cell for data "1" intensely (for example, by using the program-verify reference cell PGV3). Thus, the dynamic reference cells can be set so that the average reference current becomes stable at a predetermined value.

Figure 8:
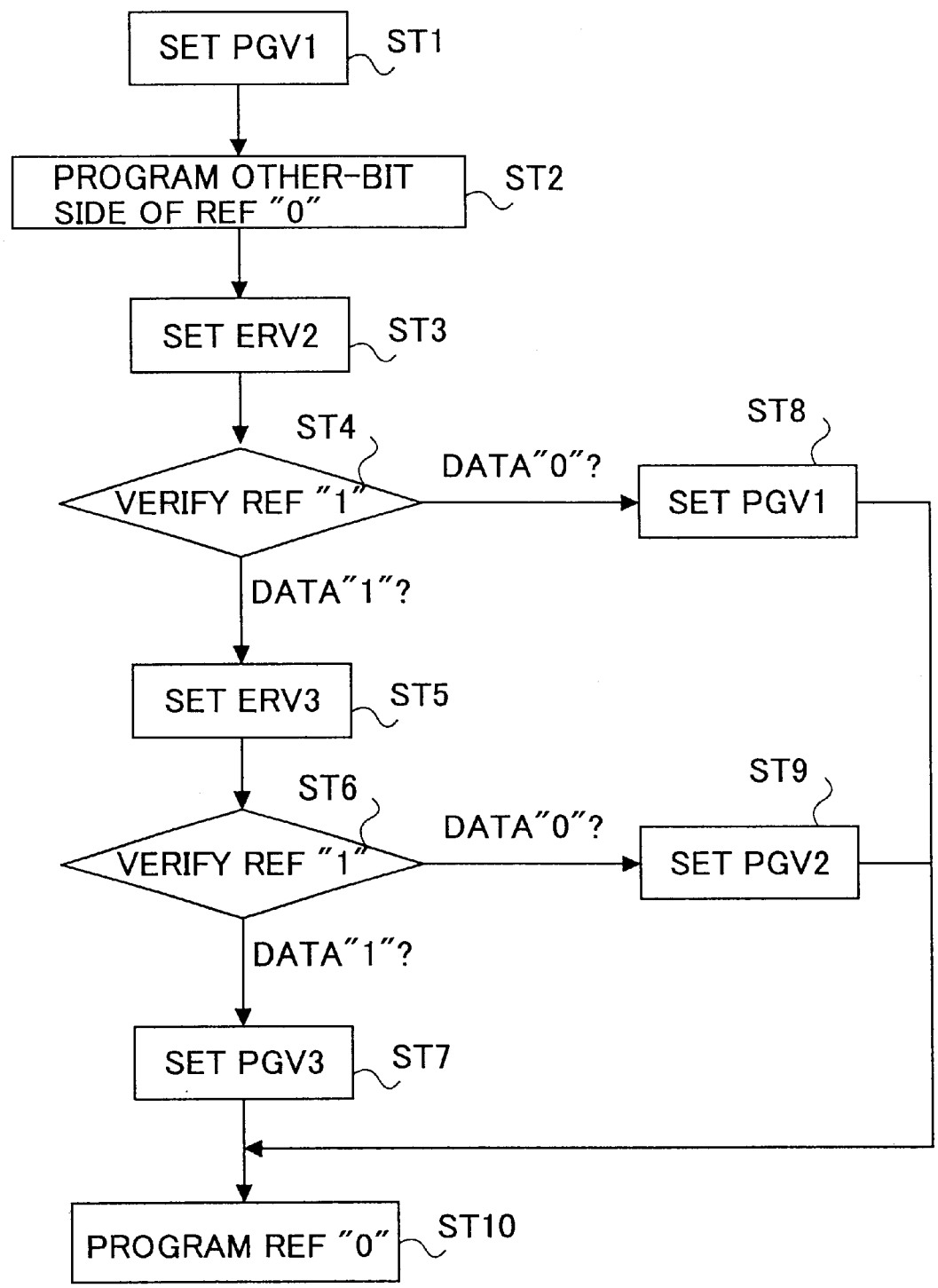
FIG. 8 is a flowchart of a method of setting dynamic reference cells according to a fourth embodiment of the present invention.

FIG. 8 is a flowchart of a method of setting the dynamic reference cells according to a fourth embodiment of the present invention. The present fourth embodiment corresponds to the above-mentioned case (3), i.e., the state in which no charge is stored in the other-bit side in the dynamic reference cell for data "1", and charge is stored in the other-bit side in the dynamic reference cell for data "0"; and Initially, each of the dynamic reference cells is set in a state of "1" where both bits are erased.

In step ST1 shown in FIG. 8, the program-verify reference cell PGV1 is set as a reference cell to be used. In step ST2, the other-bit side than the one-bit side selected for reference in the dynamic reference cell for data "0" is programmed by using the program-verify reference cell PGV1.

The following steps ST3 to ST10 are basically the same as the steps ST1 to ST8 shown in FIG. 3. By this procedure, a level of the threshold value for the selected side of the dynamic reference cell for data "1" is judged, and the selected side of the dynamic reference cell for data "0" is programmed.

As described above, in the present fourth embodiment, the other-bit side in the dynamic reference cell for data "0" is programmed so as to store charge therein. In this state, the level of the threshold value for the selected side of the dynamic reference cell for data "1" is judged, and the selected side of the dynamic reference cell for data "0" is programmed.

Figure 9:
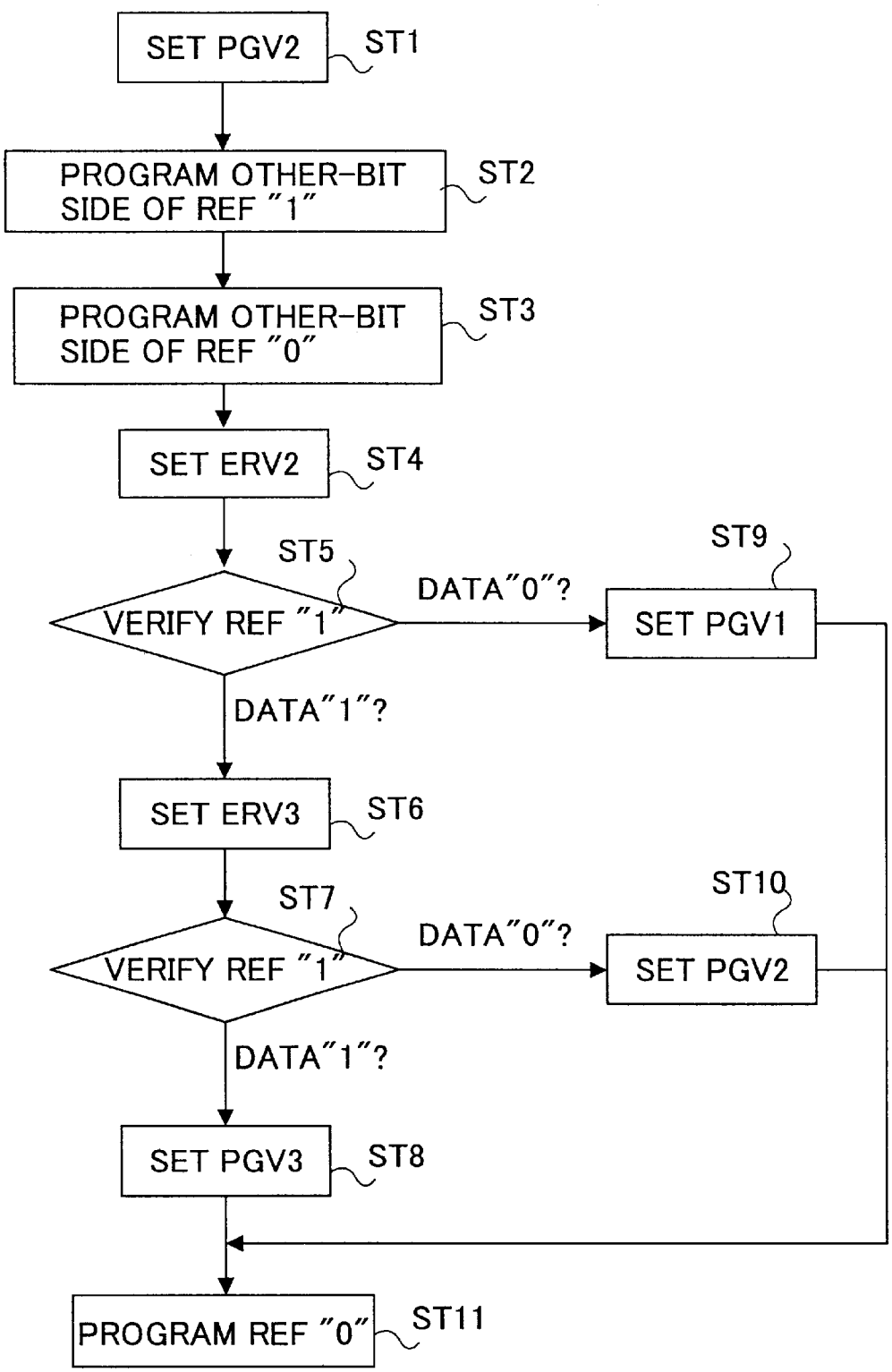
FIG. 9 is a flowchart of a method of setting dynamic reference cells according to a fifth embodiment of the present invention.

FIG. 9 is a flowchart of a method of setting the dynamic reference cells according to a fifth embodiment of the present invention. The present fifth embodiment corresponds to the above-mentioned case (4), i.e., the state in which charge is stored in the other-bit side in the dynamic reference cell for data "1", and charge is stored in the other-bit side in the dynamic reference cell for data "0".

Initially, each of the dynamic reference cells is set in a state of "1" where both bits are erased.

In step ST1 shown in FIG. 9, the program-verify reference cell PGV2 is set as a reference cell to be used. In step ST2, the other-bit side than the one-bit side selected for reference in the dynamic reference cell for data "1" is programmed by using the program-verify reference cell PGV2. Further, in step ST3, the other-bit side than the one-bit side selected for reference in the dynamic reference cell for data "0" is programmed by using the program-verify reference cell PGV2.

The following steps ST4 to ST11 are basically the same as the steps ST1 to ST8 shown in FIG. 3. By this procedure, a level of the threshold value for the selected side of the dynamic reference cell for data "1" is judged, and the selected side of the dynamic reference cell for data "0" is programmed.

As described above, in the present fifth embodiment, the other-bit side in each of the dynamic reference cells for data "0" and data "1" is programmed so as to store charge therein.

In this state, the level of the threshold value for the selected side of the dynamic reference cell for data "1" is judged, and the selected side of the dynamic reference cell for data "0" is programmed.

As is clear from the description above, the second to fifth embodiments have basically the same procedure as the first embodiment. Thus, the second to fifth embodiments can be realized by using the same or simply modified configuration of the circuit as shown in FIG. 5.

Figure 10:
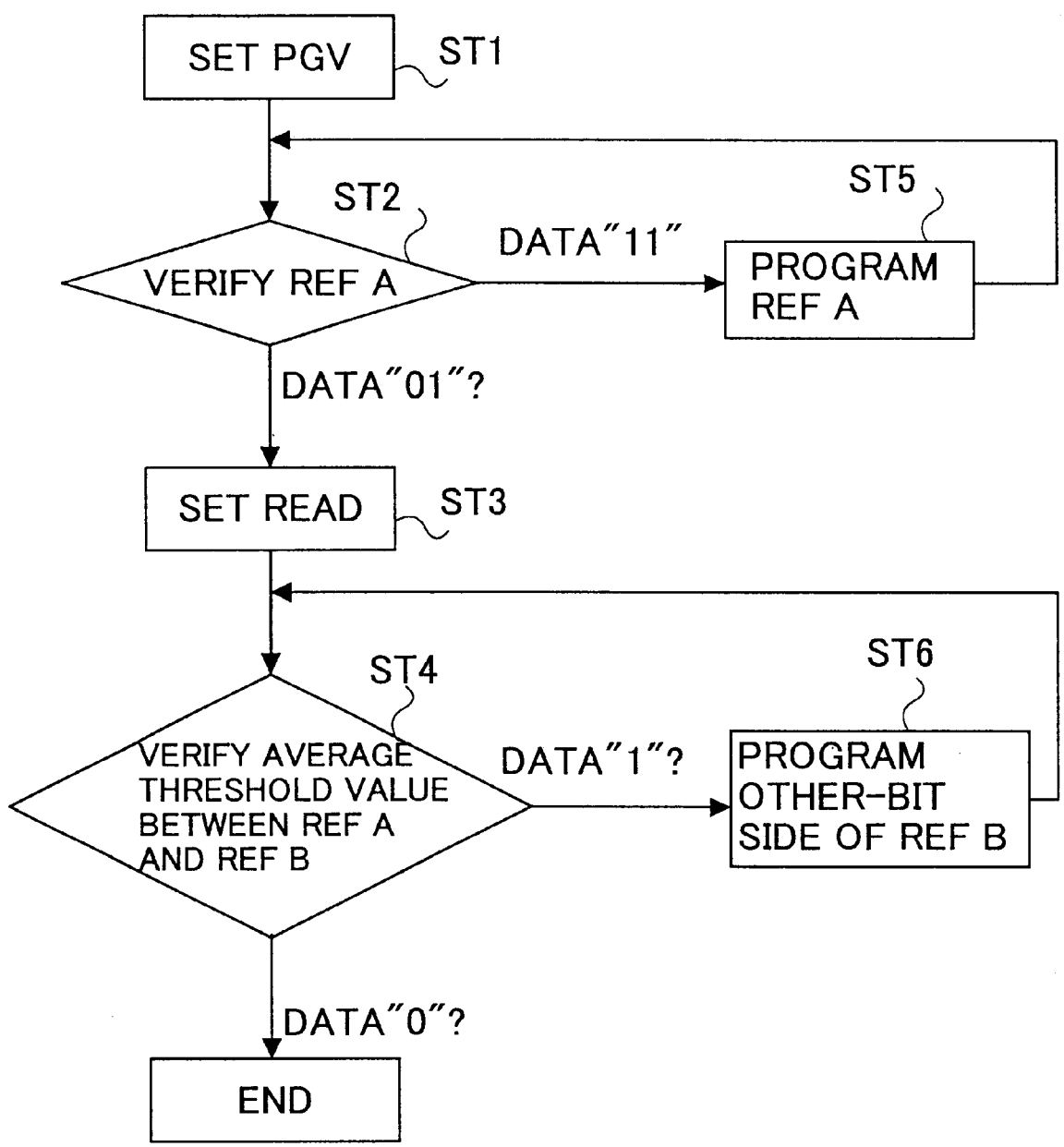
FIG. 10 is a flowchart of a method of setting dynamic reference cells according to a sixth embodiment of the present invention.

FIG. 10 is a flowchart of a method of setting the dynamic reference cells according to a sixth embodiment of the present invention. In the present sixth embodiment, the nonvolatile semiconductor memory device is a flash memory using a nitride film so as to store 2-bit information per cell, and unlike the foregoing embodiments, according to the method of the present sixth embodiment, the threshold values can be set with only one program-verify reference cell.

Initially, each of the dynamic reference cells is set in a state of "1" where both bits are erased.

In step ST1 shown in FIG. 10, a program-verify reference cell PGV is set as a reference cell to be used. In step ST2, the one-bit side selected for reference in the dynamic reference cell A for data "0" is verified by using the program-verify reference cell PGV. According to a result of this verification, in step ST5, the selected side of the dynamic reference cell A for data "0" is programmed. Thereby, data "01" is stored in the dynamic reference cell A for data "0", where a first bit of the data "01" represents data of the selected side, and a second bit of the data "01" represents data of the other-bit side than the selected side.

In step ST3, a read reference cell READ is set as a reference cell to be used. In step ST4, an average threshold value (an average current) between the selected side of the dynamic reference cell A for data "0" and the selected side of the dynamic reference cell B for data "1" is verified by using the read reference cell READ. According to a result of this verification, in step ST6, the other-bit side than the selected side of the dynamic reference cell B for data "1" is programmed. Thereby, data "10" is stored in the dynamic reference cell B for data "1".

As described above, in the present sixth embodiment, the threshold values of the dynamic reference cells are set so that the average threshold value between the selected side of the dynamic reference cell A for data "0" and the selected side of the dynamic reference cell B for data "1" comes in the vicinity of a read threshold value of the read reference cell READ. Thus, the dynamic reference cells can be set so that the average reference current becomes stable at a predetermined value.

In the above-described sixth embodiment, the selected side of the dynamic reference cell A for data "0" is programmed first, and then, the other-bit side than the selected side of the dynamic reference cell B for data "1" is programmed. However, the same effect can be obtained by first programming the dynamic reference cell B for data "1", and then programming the dynamic reference cell A for data "0". Similarly, in a flash memory storing 1-bit information per cell, the threshold value of the dynamic reference cell for data "0" can be set so that an average threshold value between the dynamic reference cell for data "0" and the dynamic reference cell for data "1" comes in the vicinity of the read threshold value.

Figure 11:
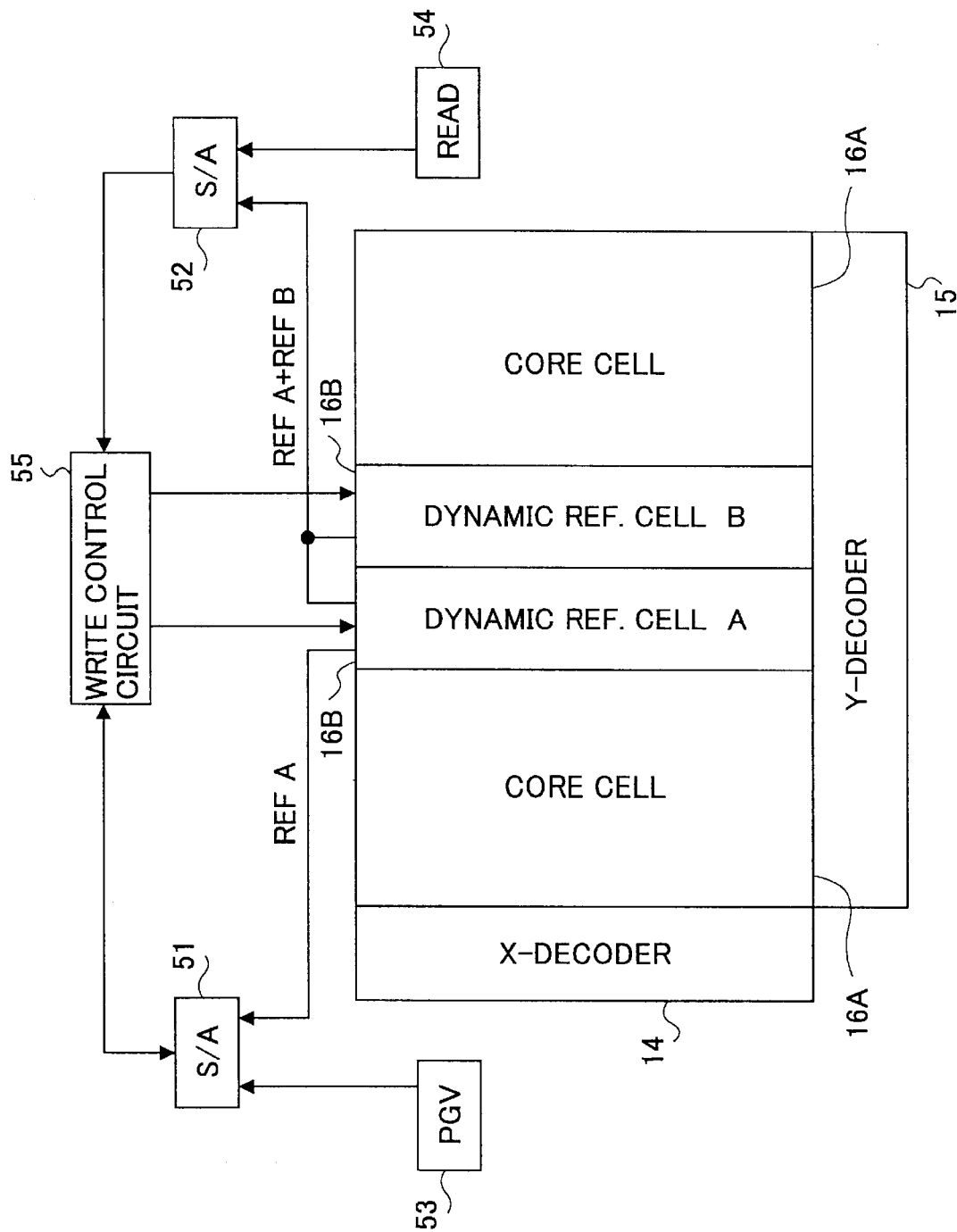
FIG. 11 shows a configuration of a circuit performing an operation of setting the reference cells according to the sixth embodiment of the present invention.

FIG. 11 shows a configuration of a circuit performing an operation of setting the reference cells according to the sixth embodiment of the present invention.

The circuit shown in FIG. 11 includes sense amplifiers (S/A) 51 and 52, a program-verify reference cell (PGV) 53, a read reference cell (READ) 54, and a write control circuit 55. The sense amplifier 51 reads the dynamic reference cell A for data "0" from the dynamic reference cell area 16B, and verifies the dynamic reference cell A for data "0" by using the program-verify reference cell 53. According to a result of this verification, the write control circuit 55 programs the dynamic reference cell A for data "0". This procedure corresponds to steps st1, st2 and st5 shown in FIG. 10.

Then, the sense amplifier 52 reads the dynamic reference cell A for data "0" and the dynamic reference cell B for data "1" from the dynamic reference cell area 16B, and verifies an average current thereof according to the read reference cell 54. According to a result of this verification, the write control circuit 55 programs the other-bit side than the selected side of the dynamic reference cell B for data "1". This procedure corresponds to steps st3, st4 and st6 shown in FIG. 10.

As described above, the circuit shown in FIG. 11 enables the dynamic reference cells to be set so that the average reference current becomes stable at a predetermined value.

Figure 12:
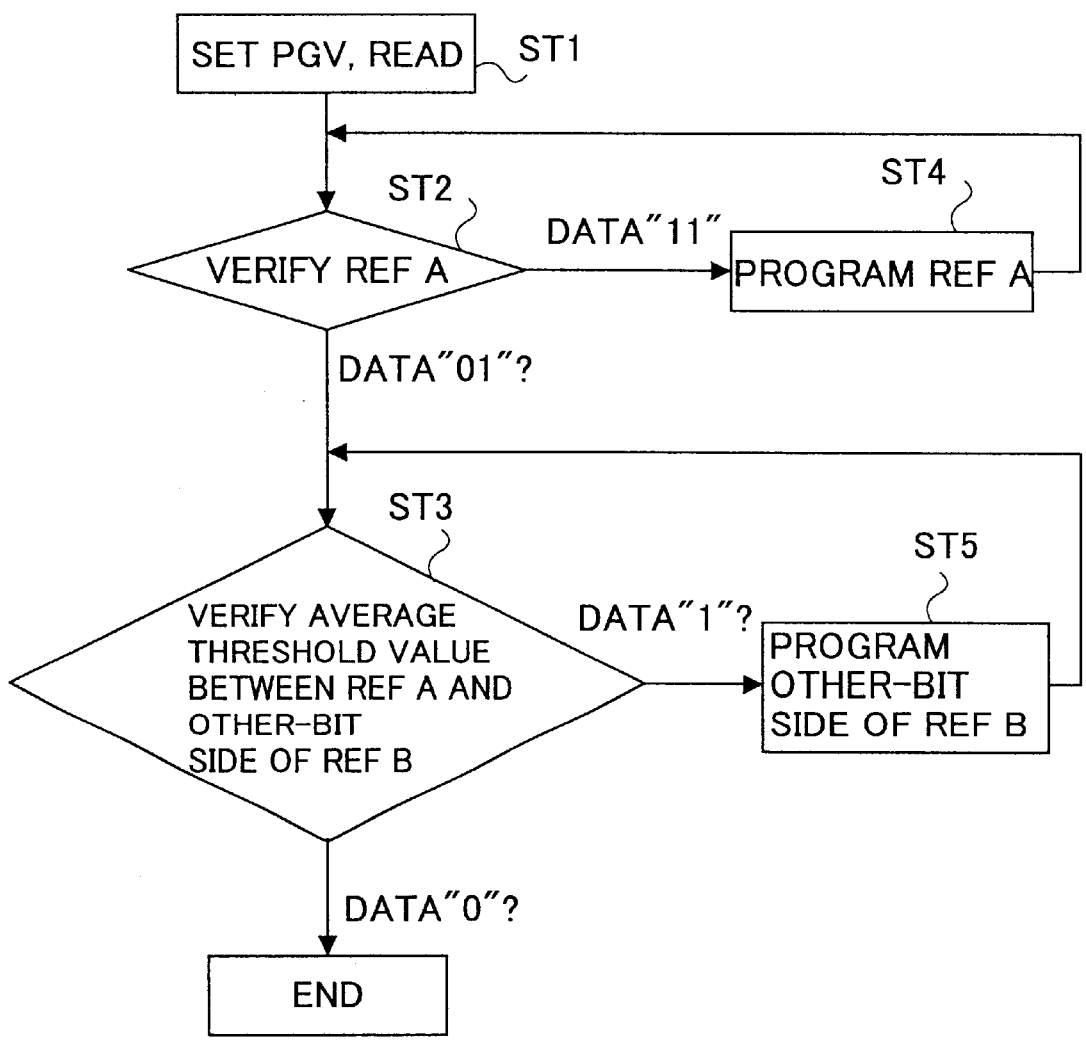
FIG. 12 is a flowchart of a method of setting dynamic reference cells according to a seventh embodiment of the present invention.

FIG. 12 is a flowchart of a method of setting the dynamic reference cells according to a seventh embodiment of the present invention. In the present seventh embodiment, the nonvolatile semiconductor memory device is a flash memory using a nitride film so as to store 2-bit information per cell in which the threshold values can be set with only one program-verify reference cell.

Initially, each of the dynamic reference cells is set in a state of "1" where both bits are erased.

In step ST1 shown in FIG. 12, the program-verify reference cell PGV and the read reference cell READ are set as reference cells to be used. In step ST2, the one-bit side selected for reference in the dynamic reference cell A for data "0" is verified by using the program-verify reference cell PGV. According to a result of this verification, in step ST4, the selected side of the dynamic reference cell A for data "0" is programmed. Thereby, data "01" is stored in the dynamic reference cell A for data "0", where a first bit of the data "01" represents data of the selected side, and a second bit of the data "01" represents data of the other-bit side than the selected side.

In step ST3, an average threshold value (an average current) between the selected side of the dynamic reference cell A for data "0" and the other-bit side than the selected side of the dynamic reference cell B for data "1" is verified by using the read reference cell READ set in step ST1 above. According to a result of this verification, in step ST5, the other-bit side of the dynamic reference cell B for data "1" is programmed. Thereby, data "10" is stored in the dynamic reference cell B for data "1".

As described above, in the present seventh embodiment, the threshold values of the dynamic reference cells are set so that the average threshold value between the selected side of the dynamic reference cell A for data "0" and the other-bit side than the selected side of the dynamic reference cell B for data "1" comes in the vicinity of the threshold value of the read reference cell READ. Accordingly, as the threshold value of the selected side of the dynamic reference cell A for data "0" becomes larger, an amount of charge injection into the other-bit side of the dynamic reference cell B for data "1" becomes smaller so that the threshold value of the selected side of the dynamic reference cell B for data "1" becomes smaller. Thus, the dynamic reference cells can be set so that the average reference current becomes stable at a predetermined value.

In the above-described seventh embodiment, the selected side of the dynamic reference cell A for data "0" is programmed first, and then, the other-bit side than the selected side of the dynamic reference cell B for data "1" is programmed. However, the same effect can be obtained by first programming the dynamic reference cell B for data "1", and then programming the dynamic reference cell A for data "0".

The present invention is not limited to the specifically disclosed embodiments, and variations and modifications may be made without departing from the scope of the present invention.

The present application is based on Japanese priority application No. 2002-053994 filed on Feb. 28, 2002, the entire contents of which are hereby incorporated by reference.

What is claimed is:

1. A nonvolatile semiconductor memory device including:
   a memory cell;
   first and second dynamic reference cells subjected to a same rewriting as performed to said memory cell; and
   a data judgment control circuit obtaining an average reference current from said first and second dynamic reference cells, and comparing a current of data read from said memory cell with said average reference current so as to judge said data,
   wherein said data judgment control circuit programs the second dynamic reference cell according to a threshold value of the first dynamic reference cell.

2. The nonvolatile semiconductor memory device as claimed in claim 1, further including a plurality of program-verify reference cells, wherein said data judgment control circuit selects one of said program-verify reference cells according to said threshold value of said first dynamic reference cell, and programs said second dynamic reference cell by using the selected one of said program-verify reference cells.

3. The nonvolatile semiconductor memory device as claimed in claim 1, further including a plurality of erase-verify reference cells, wherein said data judgment control circuit judges said threshold value of said first dynamic reference cell by using said erase-verify reference cells.

4. The nonvolatile semiconductor memory device as claimed in claim 1, wherein said memory cell stores 2-bit information by trapping an electric charge in a nitride film.

5. The nonvolatile semiconductor memory device as claimed in claim 4, further including a plurality of erase-verify reference cells and a plurality of program-verify reference cells, wherein said data judgment control circuit judges said threshold value of said first dynamic reference cell by using said erase-verify reference cells, selects one of said program-verify reference cells according to a result of judging said threshold value of said first dynamic reference cell, and programs said second dynamic reference cell by using the selected one of said program-verify reference cells.

6. The nonvolatile semiconductor memory device as claimed in claim 4, further including a plurality of program-verify reference cells, wherein said data judgment control circuit selects one of said program-verify reference cells according to said threshold value of said first dynamic reference cell, and programs an other side than a selected side of said second dynamic reference cell by using the selected one of said program-verify reference cells, the selected side being selected so as to obtain said average reference current.

7. The nonvolatile semiconductor memory device as claimed in claim 6, wherein said data judgment control circuit judges said threshold value of said first dynamic reference cell by using said program-verify reference cells.

8. The nonvolatile semiconductor memory device as claimed in claim 1, wherein said data judgment control circuit obtains the average reference current from said first and second dynamic reference cells, and programs the second dynamic reference cell by comparing said average reference current with a current of a read reference cell.

9. The nonvolatile semiconductor memory device as claimed in claim 8, wherein said memory cell stores 2-bit information by trapping an electric charge in a nitride film.

10. The nonvolatile semiconductor memory device as claimed in claim 1, wherein said memory cell stores 2-bit information by trapping an electric charge in a nitride film, and said data judgment control circuit obtains an average reference current used for programming from a selected side of the first dynamic reference cell and an other side than a selected side of the second dynamic reference cell, the selected sides being selected so as to obtain said average reference current used for judging said data read from said memory cell, and programs one of said first dynamic reference cell and said second dynamic reference cell by comparing said average reference current used for programming with a current of a read reference cell.

* * * * *